US 9,013,243 B2

(12) United States Patent
Ishii et al.

(10) Patent No.: US 9,013,243 B2
(45) Date of Patent: *Apr. 21, 2015

(54) RESONATOR ELEMENT, RESONATOR, ELECTRONIC DEVICE, ELECTRONIC APPARATUS, AND MOBILE OBJECT

(71) Applicant: Seiko Epson Corporation, Tokyo (JP)

(72) Inventors: Osamu Ishii, Tatsuno (JP); Takao Morita, Fujisawa (JP)

(73) Assignee: Seiko Epson Corporation (JP)

( * ) Notice: Subject to any disclaimer, the term of this patent is extended or adjusted under 35 U.S.C. 154(b) by 65 days.

This patent is subject to a terminal disclaimer.

(21) Appl. No.: 13/849,896

(22) Filed: Mar. 25, 2013

(65) Prior Publication Data

US 2013/0257554 A1    Oct. 3, 2013

(30) Foreign Application Priority Data

Mar. 27, 2012 (JP) ................................. 2012-070897
Feb. 15, 2013 (JP) ................................. 2013-027618

(51) Int. Cl.
   *H03B 5/32* (2006.01)
   *H01L 41/047* (2006.01)
   *H03H 9/17* (2006.01)
   *H03H 9/02* (2006.01)

(52) U.S. Cl.
   CPC ............. *H01L 41/047* (2013.01); *H03B 5/32* (2013.01); *H03H 9/17* (2013.01); *H03H 9/02157* (2013.01)

(58) Field of Classification Search
   USPC .......... 331/107 R, 116 R, 154, 158; 310/365, 310/367
   See application file for complete search history.

(56) References Cited

U.S. PATENT DOCUMENTS

| 7,129,624 | B2 | 10/2006 | Umeki et al. |
| 7,129,799 | B2 * | 10/2006 | Sasaki ........................... 331/158 |
| 8,164,235 | B2 | 4/2012 | Koyama |
| 2004/0036383 | A1 * | 2/2004 | Rubach ......................... 310/365 |
| 2009/0085428 | A1 * | 4/2009 | Maeda .......................... 310/312 |
| 2010/0327705 | A1 * | 12/2010 | Koyama ........................ 310/365 |
| 2013/0257554 | A1 | 10/2013 | Ishii et al. |

FOREIGN PATENT DOCUMENTS

| JP | 7-046072 A | 4/1995 |
| JP | 09246903 A | 9/1997 |
| JP | 11-284484 A | 10/1999 |
| JP | 2002111435 A | 4/2002 |
| JP | 2002190717 A | 7/2002 |
| JP | 2002368573 | 12/2002 |
| JP | 2004146963 A | 5/2004 |
| JP | 2004179879 A | 6/2004 |
| JP | 2005-203858 A | 7/2005 |
| JP | 2007158486 A | 6/2007 |
| JP | 2007214941 A | 8/2007 |

(Continued)

*Primary Examiner* — Joseph Chang
*Assistant Examiner* — Jeffrey Shin
(74) *Attorney, Agent, or Firm* — Harness, Dickey & Pierce, P.L.C.

(57) ABSTRACT

A resonator element includes a substrate vibrating in a thickness-shear vibration mode, a first excitation electrode disposed on one principal surface of the substrate, and has a shape obtained by cutting out four corners of a quadrangle, and a second excitation electrode disposed on the other principal surface of the substrate, and a ratio (S2/S1) between the area S1 of the quadrangle and the area S2 of the first excitation electrode fulfills 87.7%≤(S2/S1)<95.0%.

19 Claims, 12 Drawing Sheets

(56) References Cited

FOREIGN PATENT DOCUMENTS

| | | |
|---|---|---|
| JP | 2009089441 A | 4/2009 |
| JP | 2010-74840 A | 4/2010 |
| JP | 2010193496 A | 9/2010 |
| JP | 2011147053 A | 7/2011 |
| JP | 2011160094 A | 8/2011 |
| WO | WO-2009020022 A1 | 2/2009 |

\* cited by examiner

| RESONANT FREQUENCY [MHz] | hx [nm] | hz [nm] | hx/hz | Au [nm] | Ni [nm] | CONFINEMENT FACTOR M | CI [Ω] | SPURIOUS RATIO (CIs/CIm) |
|---|---|---|---|---|---|---|---|---|
| 491 | 0.14 | 0.11 | 1.27 | 45 | 7 | 12.0 | 23.5 | 4.7 |
| | 0.18 | 0.14 | 1.29 | 45 | 7 | 15.5 | 20.0 | 4.5 |
| | 0.18 | 0.14 | 1.29 | 60 | 7 | 18.9 | 19.5 | 4.1 |
| | 0.23 | 0.18 | 1.28 | 60 | 7 | 24.1 | 16.7 | 3.1 |
| | 0.21 | 0.16 | 1.31 | 90 | 7 | 30.2 | 13.1 | 2.7 |
| | 0.23 | 0.18 | 1.28 | 90 | 7 | 33.1 | 13.2 | 2.3 |
| | 0.30 | 0.24 | 1.25 | 90 | 7 | 43.2 | 11.5 | 1.5 |
| 368 | 0.18 | 0.14 | 1.29 | 90 | 7 | 15.4 | 21.4 | 4.9 |
| | 0.30 | 0.24 | 1.25 | 90 | 7 | 25.7 | 15.7 | 3.8 |
| | 0.50 | 0.40 | 1.25 | 90 | 7 | 42.8 | 11.8 | 1.5 |
| 246 | 0.28 | 0.22 | 1.27 | 120 | 7 | 14.7 | 22.1 | 4.6 |
| | 0.40 | 0.32 | 1.25 | 120 | 7 | 20.9 | 17.8 | 4.0 |
| | 0.70 | 0.56 | 1.25 | 120 | 7 | 36.7 | 14.0 | 2.5 |

FIG. 7

RESONATOR ELEMENT, RESONATOR, ELECTRONIC DEVICE, ELECTRONIC APPARATUS, AND MOBILE OBJECT

BACKGROUND

1. Technical Field

This invention relates to a resonator element for exciting a thickness-shear vibration, a resonator, an electronic device, an electronic apparatus, and a mobile object.

2. Related Art

An AT-cut quartz crystal resonator for exciting a thickness-shear vibration as a vibration mode of the principal vibration is suitable for miniaturization and higher frequency, and has a frequency-temperature characteristic showing an excellent cubic curve, and is therefore used in a variety of fields such as an oscillator and electronic equipment. In particular, in recent years, due to the progress in speeding up of the processing speed of transmission communication equipment and OA equipment, or increase in capacity of communication data and a processing amount, a demand of increase in frequency to the AT-cut quartz crystal resonator as a reference frequency signal source used therefor is increasing. In general, in order to realize the AT-cut quartz crystal resonator with a higher frequency excited in the thickness-shear vibration mode, the thickness of the vibrating portion is decreased to thereby achieve the higher frequency.

However, if the thickness of the vibrating portion is decreased for achieving the higher frequency, there arises a problem that the adjustment sensitivity of the frequency increases to degrade the frequency tuning accuracy, and thus the production yield of the resonator is degraded. To cope with this problem, JP-A-2002-111435 (Document 1) discloses the fact that the margin in tuning the frequency can be increased in the resonator of the temperature compensated oscillator by increasing the pulling sensitivity by decreasing the capacitance ratio $\gamma$ (=C0/C1; here, C0 denotes an equivalent parallel capacitance, C1 denotes an equivalent series capacitance) of the resonator by roughly evenly cutting out the four corners of a rectangular excitation electrode so that the area ratio between before and after cutting out the excitation electrode is 95% through 98%.

Further, in the paragraph [0024] of Document 1, there is a description reading that "if the area ratio is lower than 95%, it results that the vibrating portion making an actual contribution to the vibration is cut out from the excitation electrode section, and the equivalent series capacitance C1 is decreased, which makes it unachievable to obtain the effect of decreasing the capacitance ratio $\gamma$."

However, if the capacitance ratio $\gamma$ can be decreased by cutting out the four corners of the excitation electrode to achieve the area ratio of 95% through 98% as disclosed in Document 1 mentioned above, although it is sufficient for the electrical characteristics of the temperature compensated oscillator, in the resonator used for the voltage controlled oscillator, there is a problem that it is unachievable to obtain the pulling sensitivity sufficient to compensate the frequency adjustment accuracy thus deteriorated.

Therefore, it is necessary to realize the resonator making it possible to enlarge the pull range of the voltage controlled oscillator in, for example, the high-frequency band (equal to or higher than 200 MHz).

SUMMARY

An advantage of some aspects of the invention is to provide a resonator element with a capacitor ratio $\gamma$ lower than that of the resonator described in Document 1.

The invention can be implemented as the following forms or application examples.

Application Example 1

A resonator element according to this application example includes a substrate including a first principal surface and a second principal surface respectively forming an obverse surface and a reverse surface of the substrate, and vibrating in a thickness-shear vibration mode, a first excitation electrode disposed on the first principal surface, and including a side or a circumference having an internal contact with an imaginary quadrangle, and a second excitation electrode disposed on the second principal surface, and assuming that an area of the quadrangle is S1, and an area of the first excitation electrode is S2, the following relationships are fulfilled.

$$87.7\% \le (S2/S1) < 95.0\%$$

According to this application example, there can be obtained an advantage that the capacitance ratio $\gamma$ of the resonator element decreases in the high-frequency resonator element excited in the thickness-shear vibration mode of the fundamental wave.

Application Example 2

In the resonator element according to this application example, the first excitation electrode has a shape obtained by cutting out at least three corners of the quadrangle.

According to this application example, since there is provided the first excitation electrode having a shape obtained by cutting out at least three corners out of the four corners of the excitation electrode, the four corners failing to make an actual contribution to the vibration, in the high-frequency resonator element excited in the thickness-shear vibration mode of the fundamental wave, the equivalent parallel capacitance C0 decreases in proportion to the area thus decreased although the equivalent series capacitance C1 is hardly affected and is not changed. Therefore, the capacitance ratio $\gamma$ of the resonator element decreases, and there is an advantage that the voltage controlled oscillator having high pulling sensitivity can be obtained.

Application Example 3

In the resonator element according to this application example, the first excitation electrode fits into an outer edge of the second excitation electrode in a plan view.

According to this application example, since the thickness of the electrode can be increased compared to the case in which the area is the same between the first excitation electrode and the second excitation electrode in a plan view in the high-frequency resonator element excited in the thickness-shear vibration mode of the fundamental wave, there is an advantage that the ohmic loss of the electrode film can be reduced to thereby reduce the deterioration of the CI value of the principal vibration.

Further, in the case of forming the first excitation electrode and the second excitation electrode using a metal mask method, since the area of the overlapping portions of the first excitation electrode and the second excitation electrode in a plan view hardly varies even if some displacement between the masks occurs, there arises no variation of the equivalent series capacitance C1 and the equivalent parallel capacitance C0, and therefore, there is an advantage that the resonator element with a small variation of the capacitance ratio $\gamma$ can be obtained.

Application Example 4

In the resonator element according to this application example, a lead electrode is disposed so as to extend from an outer edge of a part of the first excitation electrode other than the cut-out part.

According to this application example, since the lead electrode can be prevented from passing in the area effective for decreasing the capacitance ratio γ by making the lead electrode extend from the outer edge of the part of the first excitation electrode except the area thus cut out, there is an advantage that the resonator element with lower capacitance ratio γ can be obtained.

Application Example 5

In the resonator element according to this application example, the second excitation electrode is larger than the quadrangle in a plan view, and the following relationships are fulfilled.

$$M = K \times (hx/2 \times ts) \times \sqrt{\Delta},$$

$$\Delta = (fs - fe)/fs$$

$$fs = R/[ts + te2 \times (\rho e/\rho x)]$$

$$fe = R/[ts + te \times (\rho e/\rho x)]$$

$$15.5 \leq M \leq 36.7$$

In the expressions, M denotes an energy trap coefficient, K denotes an anisotropy coefficient of the substrate, hx denotes a length of the first excitation electrode along a thickness-shear vibration direction, ts denotes a thickness of the substrate, Δ denotes an amount of frequency drop, fs denotes a cut-off frequency of the substrate, fe denotes a frequency when the excitation electrodes are disposed on the substrate, R denotes a frequency constant of the substrate, te denotes a sum of a thickness of the first excitation electrode and a thickness of the second excitation electrode, te2 denotes the thickness of the second excitation electrode, ρe denotes a density of the excitation electrodes, and ρx denotes a density of the substrate.

According to this application example, in the high-frequency resonator element excited in the thickness-shear vibration mode of the fundamental wave, it becomes possible to reduce degradation of the CI value due to the influence of the ohmic loss due to thinning of the excitation electrodes and the lead electrodes to thereby reduce the excitation intensity of the spurious in the inharmonic mode determined by the size and the film thickness of the excitation electrodes. Thus, there is an advantage that the CI value of the principal vibration is decreased, and the resonator element with a high CI-value ratio (CIs/CIm), which is a ratio between the CIm value (CIm) of the principal vibration and the CI value (CIs) of the spurious approximating the principal vibration, can be obtained.

Application Example 6

In the resonator element according to this application example, the following is fulfilled.

$$17.1 \leq M \leq 35.7$$

According to this application example, there is an advantage that it becomes possible to further decrease the excitation intensity of the spurious in the inharmonic mode.

Application Example 7

In the resonator element according to this application example, assuming that hz denotes a length of the first excitation electrode along a direction perpendicular to the thickness-shear vibration direction, the following is fulfilled.

$$1.25 \leq hx/hz \leq 1.31$$

According to this application example, if there is used the substrate, in which the displacement distribution in the displacement direction determined by the anisotropy of the crystal and the displacement distribution in the direction perpendicular thereto are different from each other, the efficiency of energy confinement of the principal vibration can be improved. Further, the capacitance ratio γ of the resonator element can be decreased.

Here, if it is assumed that the resonant frequency of the thickness-shear vibration is equal to or higher than 200 MHz, since the frequency of the resonator element excited in the thickness-shear vibration mode is determined inversely proportional to the thickness of the substrate, in the case of the high frequency equal to or higher than 200 MHz, the thickness of the substrate is reduced to a value as very thin as equal to or smaller than 8.4 μm. Therefore, it is necessary to make the film thickness of the excitation electrodes formed thereon very thin accordingly. Therefore, the influence of the ohmic loss due to thinning of the electrode significantly increases, and since these problems can be reduced by setting the energy trap coefficient M to the range described above, and there is an advantage that the resonator element capable of fulfilling the CI-value specification and the spurious specification required by the oscillator circuit can be obtained.

Application Example 8

In the resonator element according to this application example, the substrate is a quartzcrystal substrate.

According to this application example, since the quartz crystal crystal substrate has a high Q-value, there is an advantage that the resonator element superior in temperature characteristic can be obtained.

Application Example 9

In the resonator element according to this application example, the quartz crystal substrate is an AT-cut quartz crystal substrate.

According to this application example, by using the AT-cut quartz crystal substrate having a cutting angle superior in temperature characteristic as the substrate, there is an advantage that the time-tested results and the experiences regarding the photolithography technology and the etching technology can be used, and thus, it becomes possible to mass-produce the resonator element with a little variation in characteristics.

Application Example 10

A resonator according to this application example includes the resonator element according to the application example described above, and a package adapted to house the resonator element.

According to this application example, by housing the resonator element in the package, a highly reliable resonator can be obtained. For example, since the influence of a disturbance such as a temperature variation or a humidity variation, and the influence of contamination can be prevented, there is an advantage that the resonator superior in frequency reproducibility, frequency-temperature characteristic, CI-temperature characteristic, and frequency-aging characteristic can be obtained.

Application Example 11

An electronic device according to this application example includes the resonator element according to the application example described above, and an oscillator circuit adapted to drive the resonator element.

According to this application example, by configuring the electronic device using the high-frequency resonator element excited with the fundamental wave, since the capacitance ratio γ is low, there is an advantage that a voltage controlled oscillator with a broader pull range, and a preferable S/N ratio can be obtained.

Further, an oscillator, a temperature compensated oscillator, and so on can be configured as the electronic device, and there is an advantage that an oscillator superior in frequency reproducibility, aging characteristic, and frequency-temperature characteristic can be configured.

Application Example 12

An electronic apparatus according to this application example includes the resonator element according to the application example described above.

According to this application example, by using the resonator element described in the above application example in the electronic apparatus, there is an advantage that the electronic apparatus equipped with a reference frequency source superior in frequency stability in the high-frequency band, and having a preferable S/N ratio can be configured.

Application Example 13

A mobile object according to this application example includes the resonator element according to the application example described above.

According to this application example, the mobile object with high reliability can be obtained.

BRIEF DESCRIPTION OF THE DRAWINGS

The invention will be described with reference to the accompanying drawings, wherein like numbers reference like elements.

FIGS. 1A through 1C are schematic diagrams showing a structure of a resonator element according to an embodiment of the invention, wherein FIG. 1A is a plan view, FIG. 1B is a P-P cross-sectional view, and FIG. 1C is a Q-Q cross-sectional view.

FIGS. 3A and 3B are explanatory diagrams showing a vibration displacement distribution in a rectangular excitation electrode, wherein FIG. 3A is a plan view, and FIG. 3B is a vertical cross-sectional view.

FIGS. 6A through 6C are schematic diagrams each showing a structure of a resonator element according to a modified example of the embodiment of the invention, wherein FIG. 6A is a plan view showing a first modified example, FIG. 1B is a plan view of a second modified example, and FIG. 1C is a plan view of a third modified example.

FIG. 7 is a diagram showing test production conditions and measurement results of an AT-cut quartz crystal resonator element.

FIGS. 10A and 10B are schematic diagrams showing a structure of the resonator according to an embodiment of the invention, wherein FIG. 10A is a plan view, and FIG. 10B is a vertical cross-sectional view.

FIGS. 11A and 11B are schematic diagrams showing a structure of an electronic device according to an embodiment of the invention, wherein FIG. 11A is a plan view, and FIG. 11B is a vertical cross-sectional view.

DESCRIPTION OF EXEMPLARY EMBODIMENTS

Hereinafter, a resonator element, a resonator, an electronic device, an electronic apparatus, and a mobile object according to the invention will be explained in detail based on the preferred embodiments shown in the accompanying drawings.

1. Resonator Element

Firstly, a resonator element according to an embodiment of the invention will be explained.

Figures 1A, 1C:
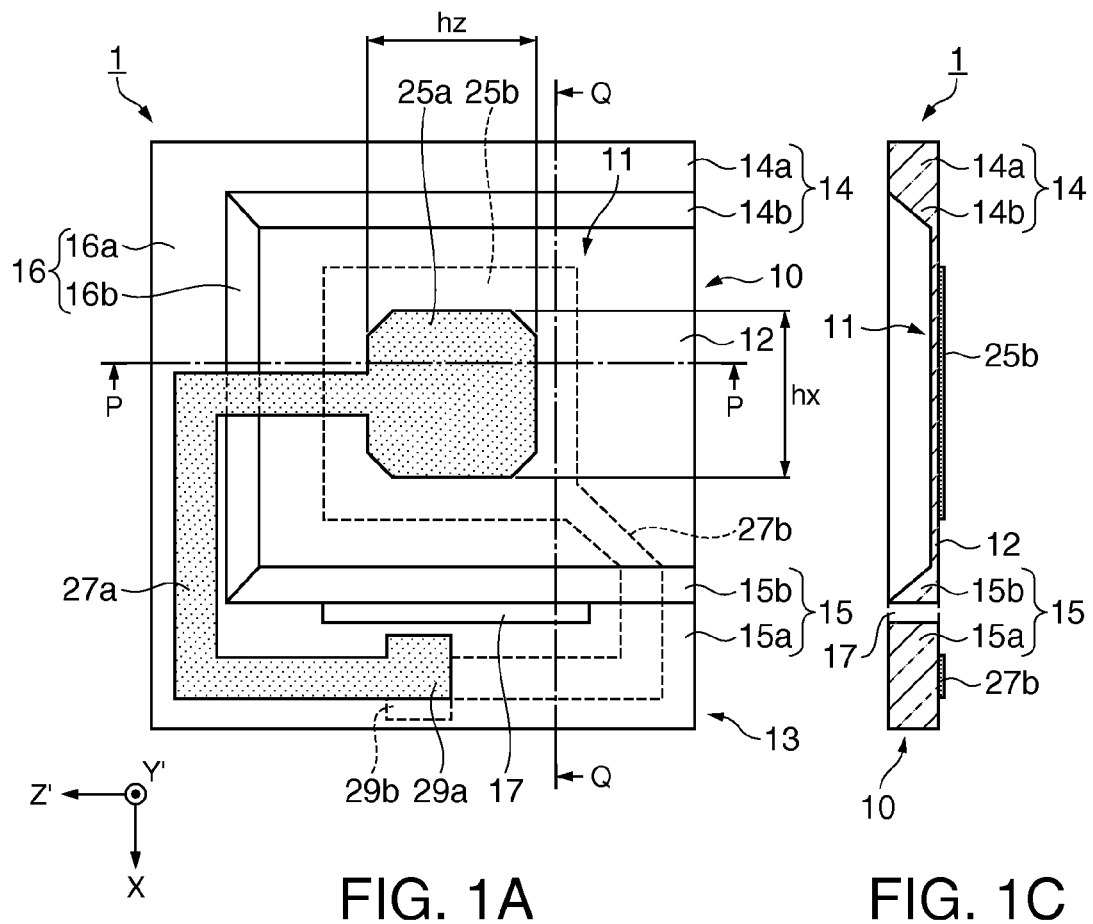
Figure 1B:
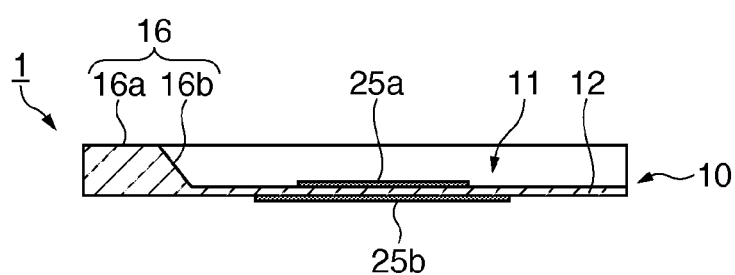

FIGS. 1A through 1C are schematic diagrams showing a configuration of a resonator element according to an embodiment of the invention, wherein FIG. 1A is a plan view of the resonator element, FIG. 1B is a P-P cross-sectional view of FIG. 1A, and FIG. 1C is a Q-Q cross-sectional view of FIG. 1A.

The resonator element 1 is provided with a substrate 10 having a vibrating section 12 and a thick-wall section 13 integrated with the vibrating section 12 and having a thickness larger than the thickness of the vibrating section 12, a first excitation electrode 25a and a second excitation electrode 25b formed on the respective principal surfaces (obverse and reverse surfaces in ±Y' directions) of the vibrating section 12 so as to be opposed to each other, and lead electrodes 27a, 27b formed so as to extend from the first excitation electrode 25a and the second excitation electrode 25b toward pad electrodes 29a, 29b provided to the thick-wall section, respectively.

The substrate 10 is provided with the vibrating section 12, which has a rectangular shape, and is shaped like a thin-wall plate perpendicular to the Y' axis with a constant thickness, the thick-wall section 13 composed of a first thick-wall section 14, a second thick-wall section 15, and a third thick-wall section 16 (also referred to as first, second, and third thick-wall sections 14, 15, and 16) integrated along the three sides except one side of the vibrating section 12, and a slit 17 for preventing a mount stress caused when fixing and supporting the substrate 10 from being transmitted to the vibrating section 12.

It should be noted that a first thick-wall main body 14a, a second thick-wall main body 15a, and a third thick-wall main body 16a (also referred to as first, second, and third thick-wall main bodies 14a, 15a, and 16a) each denote a region having an even thickness in a direction parallel to the Y' axis.

Further, a first tilted portion 14b, a second tilted portion 15b, and a third tilted portion 16b (also referred to as first, second, and third tilted portions 14b, 15b, and 16b) denote tilted surfaces appearing between the first, second, and third thick-wall main bodies 14a, 15a, and 16a and the vibrating section 12, respectively.

One of the principal surfaces of the vibrating section 12 and one of the surfaces of each of the first, second, and third thick-wall sections 14, 15, and 16 are disposed on the same plane, namely on the X-Z' plane of the coordinate axes shown in FIG. 1A, the surface (the lower surface located on the −Y' side in FIG. 1B) is called a flat surface, and the opposite surface (the upper surface located on the +Y' side in FIG. 1B) having a recessed section 11 is called a recessed surface.

In the embodiment shown in FIGS. 1A through 1C, the first excitation electrode 25a is formed to have a quadrangular shape, preferably a shape obtained by cutting out the four corners of a rectangle. The second excitation electrode 25b has a quadrangular shape, preferably a rectangular shape. The first excitation electrode 25a and the second excitation electrode 25b are formed so as to overlap the respective principal surfaces (the obverse side and the reverse side) in a roughly central portion of the vibrating section 12 in a plan view. It should be noted that although it is preferable that the sides of the first excitation electrode 25a have internal contact with an imaginary rectangle, and the four corners of the rectangle are cut out so that the areas of the four corners thus cut out are equal to each other, even if the difference of about 10% occurs taking the production tolerance into consideration, it has been confirmed that the difference does not affect the actual vibration, and there is no problem, which affects the advantage obtained by this embodiment.

It should be noted that in the embodiment shown in FIGS. 1A through 1C, the excitation electrode 25a as the first excitation electrode and the excitation electrode 25b as the second excitation electrode are different in size from each other, and the excitation electrode 25b is larger than the excitation electrode 25a. The region actually excited in the vibrating section 12 is the region sandwiched by the excitation electrode 25a and the excitation electrode 25b. Specifically, the region making a contribution to actually exciting the vibrating section 12 in the excitation electrode 25b (the second excitation electrode) is a portion overlapping the excitation electrode 25a (the first excitation electrode) in a plan view. In other words, the second excitation electrode is composed of the electrode making a contribution to the excitation, and the electrode, which is integrated with the outer edge of the electrode making the contribution to the excitation, and does not make a contribution to the excitation.

Further, regarding portions connected to the lead electrodes 27a, 27b, the shapes and the areas of the first excitation electrodes 25a and the second excitation electrode 25b will be explained taking an extended line (an imaginary line) along the outer edge (the outer side) of the excitation electrode shape as a boundary.

The lead electrode 27a extends from the excitation electrode 25a formed on the recessed surface, passes on the third tilted portion 16b and the third thick-wall main body 16a from the surface of the vibrating section 12, and is conductively connected to the pad electrode 29a formed on the recessed surface of the second thick-wall main body 15a. Further, the lead electrode 27b extends from the excitation electrode 25b formed on the flat surface, and is conductively connected to the pad electrode 29b formed on the flat surface of the second thick-wall main body 15a via an end edge portion of the flat surface of the substrate 10.

The embodiment shown in FIG. 1A is an example of an extraction structure of the lead electrodes 27a, 27b, and the lead electrode 27a can pass on another thick-wall section. However, it is desirable that the lengths of the lead electrodes 27a, 27b are the shortest, and it is desirable to suppress increase in capacitance by giving consideration to preventing the lead electrodes 27a, 27b from intersecting with each other across the substrate 10.

Further, the first excitation electrode 25a, the second excitation electrode 25b, the lead electrodes 27a, 27b, and the pad electrodes 29a, 29b are deposited by, for example, depositing nickel (Ni) as a foundation layer, and stacking gold (Au) as an upper layer thereon using a vapor deposition device, a sputtering device, or the like. It should be noted that it is also possible to use chromium (Cr) instead of nickel (Ni) of the foundation layer, and silver (Ag) or platinum (Pt) instead of gold (Au) of the upper layer as the electrode materials.

Figure 2:
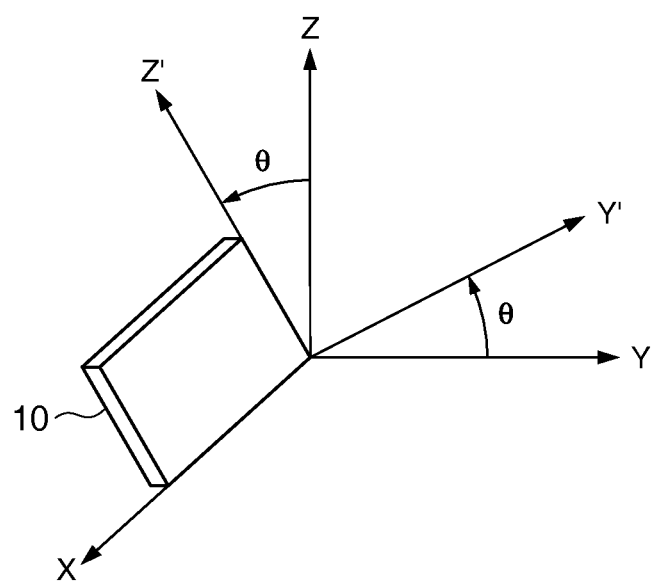
FIG. 2 is a diagram for explaining a relationship between an AT-cut quartz crystal substrate and a crystal axes.

A piezoelectric material such as a quartzcrystal belongs to a trigonal system, and has the crystal axes X, Y, and Z perpendicular to each other as shown in FIG. 2. The X axis, the Y axis, and the Z axis are called an electrical axis, a mechanical axis, and an optical axis, respectively. Further, among the quartz crystal substrates, a "rotated Y-cut quartz crystal substrate" carved out from the quartz crystal along a plane obtained by rotating the X-Z plane as much as an angle $\theta$ around the X axis is used as the substrate 10. For example, in the case of the AT-cut quartz crystal substrate, the angle $\theta$ is about 35° 15'. It should be noted that the Y' axis and the Z' axis are also obtained by rotating the Y axis and the Z axis as much as the angle $\theta$ around the X axis, respectively. Therefore, the AT-cut quartz crystal substrate has the crystal axes X, Y', and Z' perpendicular to each other. In the AT-cut quartz crystal substrate, the thickness direction is the Y'-axis direction, the principal surface is the X-Z'plane (the plane including the X axis and the Z' axis) perpendicular to the Y' axis, and the thickness-shear vibration is excited as the principal vibration.

In other words, as shown in FIG. 2, assuming that an axis obtained by tilting the Z axis described above so that the +Z side thereof is rotated toward the −Y direction of the Y axis described above taking the X axis of the orthogonal coordinate system composed of the X axis (the electrical axis), the Y axis (the mechanical axis), and the Z axis (the optical axis) as the rotational axis is the Z' axis, and an axis obtained by tilting the Y axis described above so that the +Y side thereof is rotated toward the +Z direction of the Z axis described above taking the X axis as the rotational axis is the Y' axis, the substrate 10 is the "rotated Y-cut quartz crystal substrate" taking the plane including the X axis described above and the Z' axis described above as a principal surface, and taking the direction along the Y' axis described above as the thickness direction.

It should be noted that the substrate 10 according to this embodiment is not limited to the AT-cut substrate with the angle $\theta$ of 35° 15', but can widely be applied to, for example, a BT-cut substrate exciting the thickness-shear vibration.

Further, although the explanation is presented using the example of disposing the thick-wall section along the outer edge of the vibrating section 12, the invention is not limited thereto, but can widely be applied also to a substrate having the thick-wall section disposed along the entire outer edge of the vibrating section 12, and a plate-like substrate not provided with the thick-wall section.

The voltage controlled oscillator is composed of the resonator, an oscillator circuit section, and a control voltage terminal including a variable capacity diode, and has a pull range, in which the oscillation frequency of the resonator is varied in accordance with the control voltage, as an important specification. Since the pull range is the sum of the absolute pull range (APR) necessary for transmission communication equipment and the frequency tolerance (a frequency variation due to the frequency tolerance, frequency-temperature characteristic, and the power supply voltage, a frequency variation due to the load, a frequency variation due to reflow, and a frequency variation due to aging), the voltage controlled oscillator compensates the frequency variation amount due to the variation of the external environment of the oscillator and the oscillator circuit condition by itself. Therefore, the fact that the broad pull range can be provided is very important for improving the production yield of the resonator since the frequency tolerance due to the manufacture and the design can be eased.

Here, the pulling sensitivity S of the voltage controlled oscillator is expressed as the formula 1 described below.

$$S = -\Delta CL/2 \times \gamma \times C0 \times (1 + CL/C0)^2 \quad (1)$$

Here, $\Delta CL$ denotes a load capacitance variation, $\gamma$ denotes the capacitance ratio (C0/C1), C0 denotes an equivalent parallel capacitance, and CL denotes a load capacitance.

According to the formula 1, if the load capacitance CL constituted by the oscillator circuit is constant, the pulling sensitivity S is determined by the equivalent parallel capacitance C0 of the resonator element and the capacitance ratio $\gamma$, and in particular, the influence of the capacitance ratio $\gamma$ is significant. Therefore, if the capacitance ratio $\gamma$ is low, the pulling sensitivity S of the voltage controlled oscillator can be increased to a high level, and thus, the production yield of the resonator can be improved.

Figure 3A:
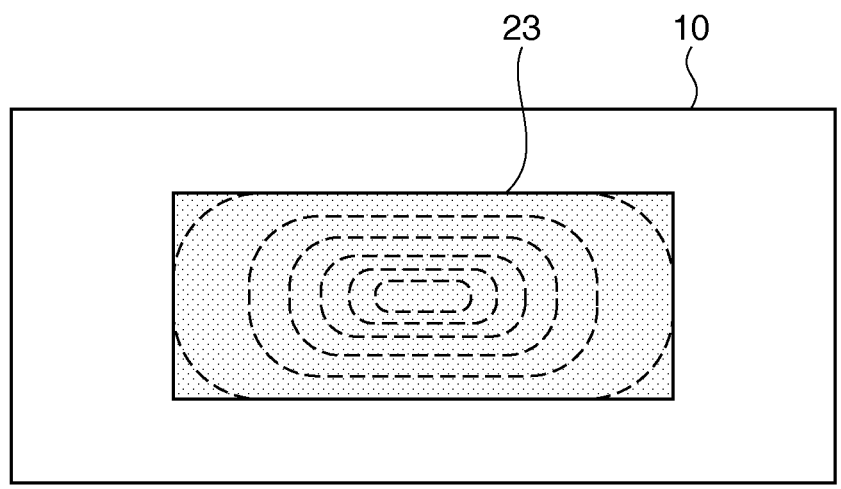
Figure 3B:
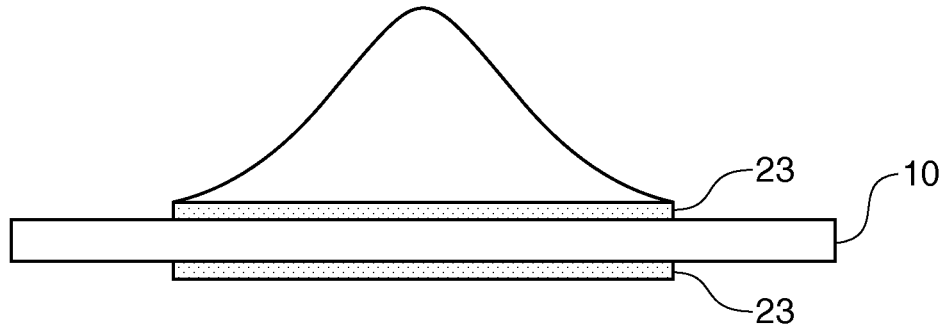

FIGS. 3A and 3B show the result obtained by calculating the vibration displacement distribution in the thickness-shear vibration mode of the fundamental wave of the resonator element having an excitation electrode 23 having a rectangular shape using a finite element method. The drawing shows the fact that the vibration displacement is very small in the four corner portions of the excitation electrode 23, and these portions do not make a contribution to the actual vibration. Here, the equivalent parallel capacitance C0 of the resonator element is a capacitance between the obverse and reverse excitation electrodes, and therefore, depends on the area of the portions opposed to each other. However, the equivalent series capacitance C1 is a capacitance component in the actual vibrating section, and therefore, does not depend thereon providing the area of the excitation electrode 23 is sufficiently large. Therefore, by removing a part of the excitation electrode 23, the part not making a contribution to the actual vibration, it is possible to decrease only the equivalent parallel capacitance C0 without affecting the equivalent series capacitance C1, and therefore, the resonator element with the low capacitance ratio $\gamma$ can be obtained.

Figure 4:
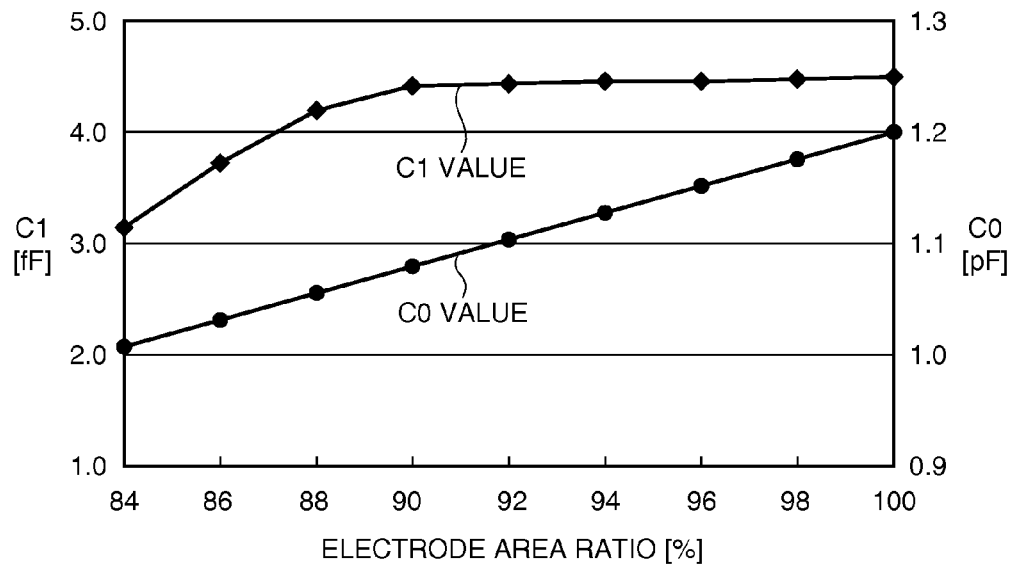
FIG. 4 is a diagram showing a C1 value and a C0 value of the resonator element with respect to an electrode area ratio.

FIG. 4 shows the C1 value and the C0 value with respect to the electrode area ratio (S2/S1) of the AT-cut quartz crystal resonator element experimentally manufactured in the embodiment shown in FIGS. 1A through 1C, and having a resonant frequency in the 491 MHz band.

The drawing shows the value of the equivalent series capacitance C1 and the value of the equivalent parallel capacitance C0 of the principal vibration with respect to the electrode area ratio (S2/S1) in the case of taking the area (0.30 mm×0.24 mm) of the rectangular excitation electrode as the reference area S1, and taking the area of the rectangular electrode as the area S2, wherein the rectangular electrode has electrode sections on the four corners thereof, and the electrode sections are gradually removed.

It has turned out from FIG. 4 that the equivalent series capacitance C1 is only slightly affected by the decrease in the electrode area ratio (S2/S1) since the part, about 90% of which does not make a contribution to the vibration, is removed, and shows a roughly constant value, but if the removed part exceeds about 90% thereof, the vibration starts being affected, and the equivalent series capacitance C1 shows a tendency of decreasing. Further, regarding the equivalent parallel capacitance C0, it has been confirmed that there is a tendency of decreasing in proportion to the decrease in the electrode area ratio (S2/S1).

Therefore, the inventors of the invention have performed the experiments and simulations over and over again and then analyzed the results regarding the region where no substantially harmful influence is exerted on the characteristics of the principal vibration of the AT-cut quartz crystal resonator element, the capacitance ratio $\gamma$ is decreased, and further the pulling sensitivity is made more preferable than in the related art even if the electrode area ratio (S2/S1) exceeds about 90%.

Figure 5:
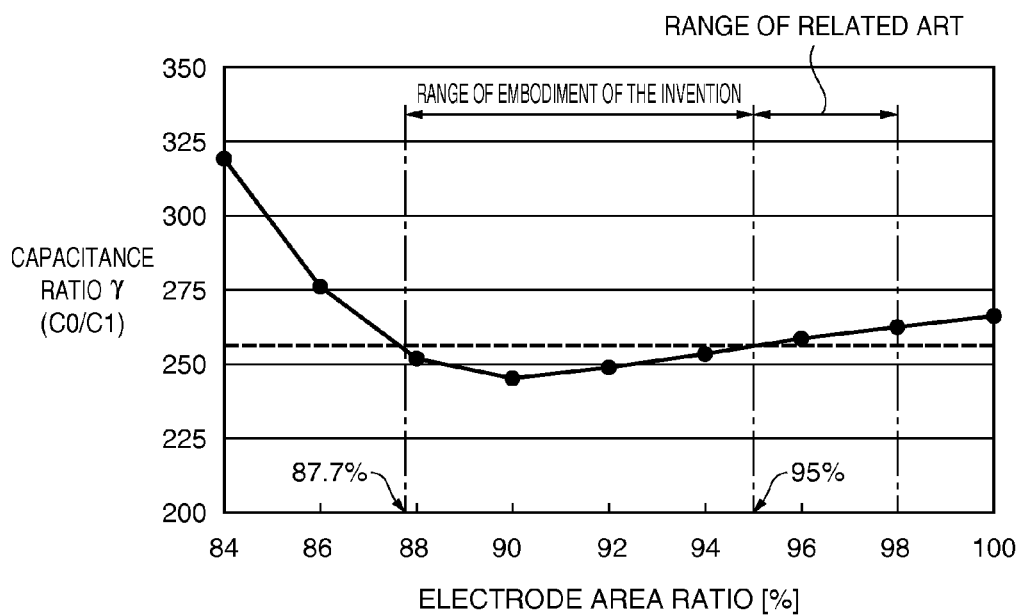
FIG. 5 is a diagram showing a capacitance ratio γ of the resonator element with respect to the electrode area ratio.

FIG. 5 is a diagram showing the capacitance ratio $\gamma$ of the AT-cut quartz crystal resonator element with respect to the electrode area ratio (S2/S1), and the capacitance ratio $\gamma$ shows a tendency of decreasing as the electrode area ratio (S2/S1) decreases, then gradually increasing after the electrode area ratio (S2/S1) reaches a level equal to or lower than 90%, and then exceeding the initial value of the capacitance ratio $\gamma$ if the electrode area ratio (S2/S1) is equal to or lower than about 87.7%. From the result, it has been confirmed that if the electrode area ratio (S2/S1) between the area S2 of the shape obtained by cutting out the four corners of the rectangle and the area S1 of the rectangular excitation electrode used as a reference is set to a value fulfilling 87.7%≤(S2/S1)<95%, the resonator element with the capacitance ratio $\gamma$ lower than in the related art can be obtained.

In Document 1 as a related art material, there is a description reading that "if the area ratio is lower than 95%, it results that the vibrating portion making an actual contribution to the vibration is cut out from the excitation electrode section, and the equivalent series capacitance C1 is decreased, which makes it unachievable to obtain the effect of decreasing the capacitance ratio $\gamma$," and it is thought to be unachievable to further decrease the capacitance ratio $\gamma$. However, the inventors of the invention have succeeded in finding out the fact that there exists the region where the capacitance ratio $\gamma$ can further be decreased in the region where the electrode area ratio (S2/S1) fulfills 87.7%≤(S2/S1)<95%, namely the region where it is thought to be impossible in Document 1.

Although the invention is explained hereinabove based on the embodiment shown in FIGS. 1A through 1C, the invention is not limited thereto, but it has been verified that the capacitance ratio $\gamma$ can be decreased also in each of the modified examples respectively shown in FIGS. 6A through 6C.

Figure 6A:
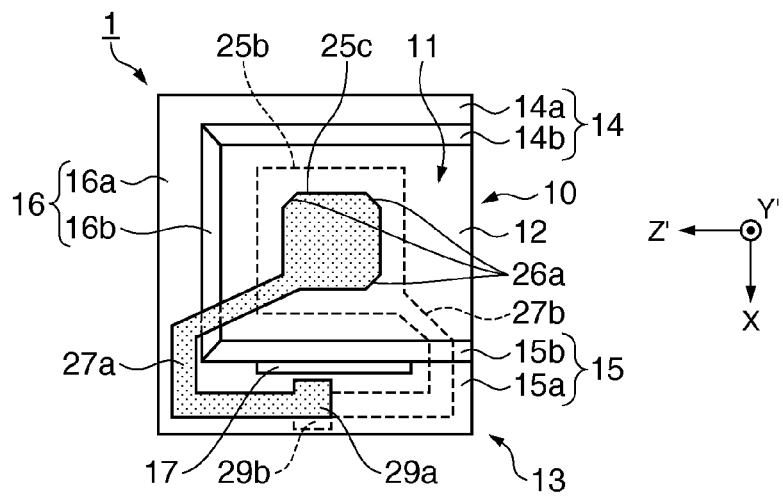

In the first modified example shown in FIG. 6A, the first excitation electrode 25c is formed to have a shape having cut-out portions 26a in three corners of a quadrangle, and the remaining corner is not provided with the cut-out portion 26a since the lead electrode 27a is connected thereto.

Figure 6B:
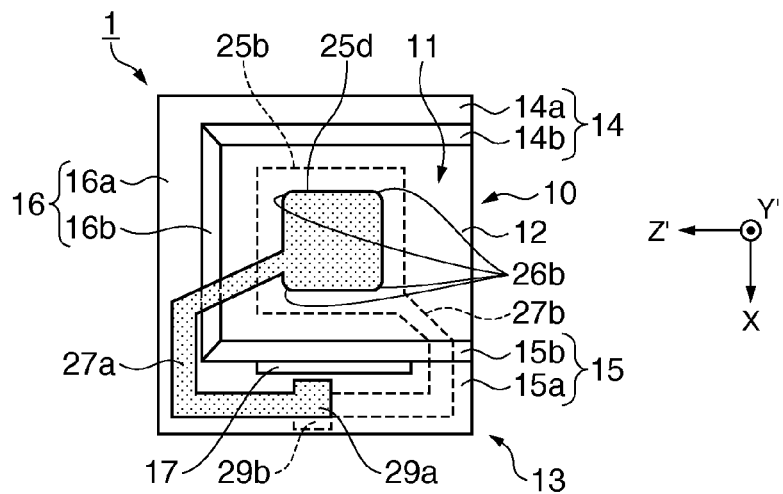

In the second modified example shown in FIG. 6B, the first excitation electrode 25d is formed to have a shape having cut-out portions 26b each having a curved shape such as an arc shape in the four corners of the quadrangle.

Figure 6C:
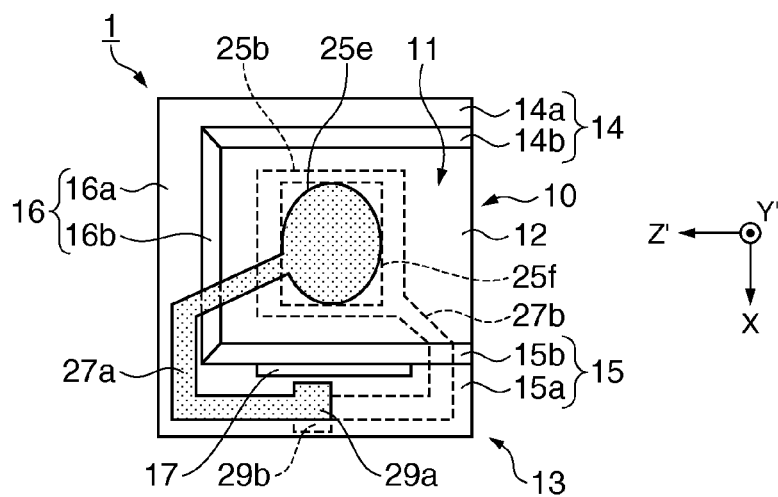

In the third modified example shown in FIG. 6C, the first excitation electrode 25e is formed to have an elliptical shape with an outer circumference having an internal contact with an imaginary rectangle 25f.

In each of these modified examples, if the electrode area ratio (S2/S1) fulfills 87.7%≤(S2/S1)<95%, the capacitance ratio γ can be decreased.

Then, in general, in the thickness-shear vibration mode, by forming a partial electrode on the substrate or providing a thickness difference, the vibration energy can be confined in the vicinity of that part, and a stable resonant frequency can be obtained. The resonant frequency of the confinement mode in this case is expressed as a function of the energy trap coefficient M obtained by the thickness ts of the substrate, and the film thickness te and the size hx of the excitation electrode.

The energy trap coefficient M is expressed by the formula 2 described below.

$$M = K \times (hx/2 \times ts) \times \sqrt{\Delta} \quad (2)$$

Here, K denotes the anisotropy coefficient (1.538 in the case of the AT-cut substrate) of the substrate, hx denotes a dimension of the excitation electrode along the displacement direction of the thickness-shear vibration, ts denotes the thickness of the substrate, and Δ denotes an amount of frequency drop. It should be noted that in the case in which the excitation electrode has a shape other than a rectangular shape such as a circular shape or an elliptical shape, hx denotes the maximum value of the lengths along the displacement direction in the thickness-shear vibration mode as the dimension.

Further, the amount of frequency drop Δ is expressed by the formula 3 described below.

$$\Delta = (fs - fe)/fs \quad (3)$$

Here, fs denotes a cut-off frequency of the substrate, and fe denotes the frequency in the case of depositing the excitation electrode on the entire surface of the substrate.

It should be noted that if the shape and the area are the same between the obverse and reverse excitation electrodes, the cut-off frequency fs of the substrate is expressed by the formula 4 described below, and the frequency fe in the case of depositing the excitation electrode on the entire surface of the substrate is expressed by the formula 5 described below.

$$fs = R/ts \quad (4)$$

$$fe = R/[ts + te \times (\rho e/\rho x)] \quad (5)$$

Here, R denotes the frequency constant of the substrate, ts denotes the thickness of the substrate, te denotes the sum of the thicknesses of the obverse and reverse excitation electrodes, ρe denotes the density of the excitation electrode, and ρx denotes the density of the substrate.

Further, if the shape and the area are different between the obverse and reverse excitation electrodes, the cut-off frequency fs of the substrate is expressed by the formula 6 described below, and the frequency fe in the case of depositing the excitation electrode on the entire surface of the substrate is expressed by the formula 7 described below.

$$fs = R/[ts + te2 \times (\rho e/\rho x)] \quad (6)$$

$$fe = R/[ts + te \times (\rho e/\rho x)] \quad (7)$$

Here, R denotes the frequency constant of the substrate, ts denotes the thickness of the substrate, te2 denotes the thickness of the excitation electrode with a larger area, te denotes the sum of the thicknesses of the obverse and reverse excitation electrodes, ρe denotes the density of the excitation electrode, and ρx denotes the density of the substrate. Further, in the formula 2, it is assumed that hx denotes the dimension of the excitation electrode with a smaller area along the displacement direction of the thickness-shear vibration.

According to the formula 2 through the formula 7, in the case in which the shape and the area are different between the obverse and reverse excitation electrodes, if the thickness is of the substrate, the thickness te and the dimension hx of the excitation electrode, and so on are in the same conditions, it results that the thickness of the excitation electrode with a larger area is added to the thickness of the substrate compared to the case in which the shape and the area are the same between the obverse and reverse excitation electrodes, and therefore, it results that the cut-off frequency fs of the substrate drops due to the increase in thickness of the substrate. Therefore, since the amount of frequency drop Δ decreases, the energy trap coefficient M decreases, and it becomes easy to reduce the spurious in the inharmonic mode.

Further, in the case of keeping the energy trap coefficient M constant, the film thickness te of the excitation electrode can be set thicker compared to the case in which the shape and the area are the same between the obverse and reverse excitation electrodes.

In general, it is said that in the thickness-shear vibration mode of the AT-cut quartz crystal substrate, the requirement for confining the single mode of the fundamental wave is that the energy trap coefficient M is equal to or lower than 2.8.

For example, in the case of the AT-cut quartz crystal resonator element vibrating at a resonance frequency in the 491 MHz band, if the excitation electrode dimension hx is set to 0.30 mm, the thickness for achieving the energy trap coefficient M=2.8 is as very thin as about 1 nm, which is an unachievable film thickness from a manufacturing point of view, and even if the film thickness can be realized, the CI-value increases significantly due to the influence of the ohmic loss caused by the thinning of the electrode, and it is unachievable to cause oscillation in the oscillator circuit.

Therefore, since the high-frequency resonator element is required to have the film thickness increased in order to avoid the ohmic loss due to the electrode film thickness, the energy trap coefficient M increases, and therefore, it is unachievable to confine only the principal vibration, but the spurious in the inharmonic mode is also confined. However, since the oscillator circuit theoretically oscillates with only the principal vibration providing the CI value of the spurious is more than 1.8 times as large as the CI value of the principal vibration, no problem arises.

FIG. 7 is a diagram showing test production conditions and measurement results of the AT-cut quartz crystal resonator element, which vibrates at the resonant frequency in the 246 MHz band through the 491 MHz band, and is experimentally manufactured in the embodiment shown in FIGS. 1A through 1C.

It should be noted that the first excitation electrode 25a has a rectangular shape with no cutting out in the four corners.

In the first excitation electrode 25a and the second excitation electrode 25b, the thickness of the nickel (Ni) layer as the foundation layer is fixed to 7 nm, and the thickness of the gold (Au) layer as the upper layer is varied in a range of 45 nm through 120 nm. In the first excitation electrode 25a, hx is varied in a range of 0.14 mm through 0.70 mm, and hz is varied in a range of 0.11 mm through 0.56 mm so that hx/hz fulfills 1.25≤hx/hz≤1.31 cantered on hx/hz=1.28. It should be noted that hz denotes the dimension (the length) of the excitation electrode 25a along a direction perpendicular to the thickness-shear vibration direction.

Further, in order to avoid the influence of the ohmic loss, the lead electrodes 27a, 27b and the pad electrodes 29a, 29b on the obverse and reverse sides are each formed by stacking a layer of nickel (Ni) with a thickness of 7 nm in an upper layer section of a layer provided with the film thickness equivalent to the excitation electrodes, and then stacking a gold (Au) layer with a thickness of 200 nm thereon.

Here, the test production conditions shown in FIG. 7 fulfill the formulas 2, 3, 6, and 7 described above.

$$M = K \times (hx/2 \times ts) \times \sqrt{\Delta} \quad (2)$$

$$\Delta = (fs - fe)/fs \quad (3)$$

$$fs = R/[ts + te2 \times (\rho e/\rho x)] \quad (6)$$

$$fe = R/[ts + te \times (\rho e/\rho x)] \quad (7)$$

It should be noted that the parameters therein are as follows.
K (the anisotropy coefficient of the AT-cut substrate)=1.538
R (the frequency constant of the AT-cut substrate)=1.67 (MHz·mm)
$\rho x$ (the density of the AT-cut substrate)=2.649 (g/cm$^3$)
$\rho_{Au}$ (density of gold)=19.3 (g/cm$^3$)
$\rho_{Ni}$ (density of nickel)=8.9 (g/cm$^3$)
The density $\rho e$ of the excitation electrode formed of a double-layered structure is calculated as follows.

$$\rho e = (\rho_{Au} \times t_{Au} + \rho_{Ni} \times t_{Ni})/(t_{Au} + t_{Ni})$$

Here, $t_{Au}$ denotes the thickness of the gold (Au) layer as the upper layer, and $t_{Ni}$ denotes the thickness of the nickel (Ni) layer as the foundation layer.

Further, fs denotes the cut-off frequency of the vibrating section 12, fe denotes a frequency in the case of providing the excitation electrode to the vibrating section 12.

Figure 8:
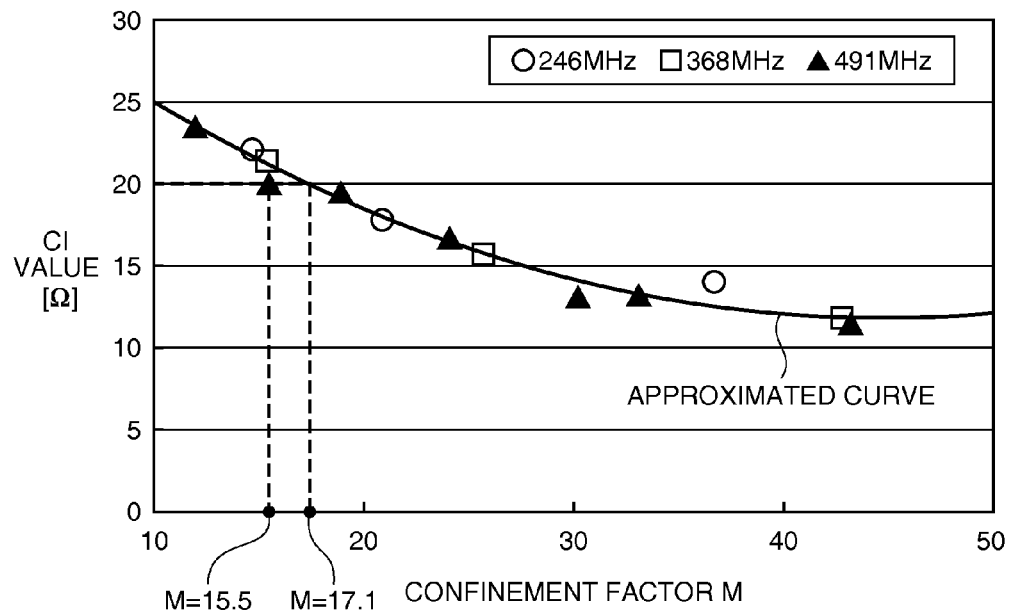
FIG. 8 is a diagram showing a CI value of a resonator with respect to an energy trap coefficient M.

FIG. 8 shows the CI value with respect to the energy trap coefficient M of the AT-cut quartz crystal resonator element shown in FIG. 7 by plotting it on a graph. As the energy trap coefficient M increases, the CI value shows a tendency of decreasing, and the reason can be thought that the influence of the ohmic loss is reduced due to the increase in the film thickness of the electrode, and that the excitation charge increases and the resistance decreases due to the increase in the electrode area.

Therefore, according to FIG. 8, by setting the energy trap coefficient M to be equal to or higher than 17.1, the CI value specification (CI≤20Ω) required by the oscillator circuit can be satisfied.

Figure 9:
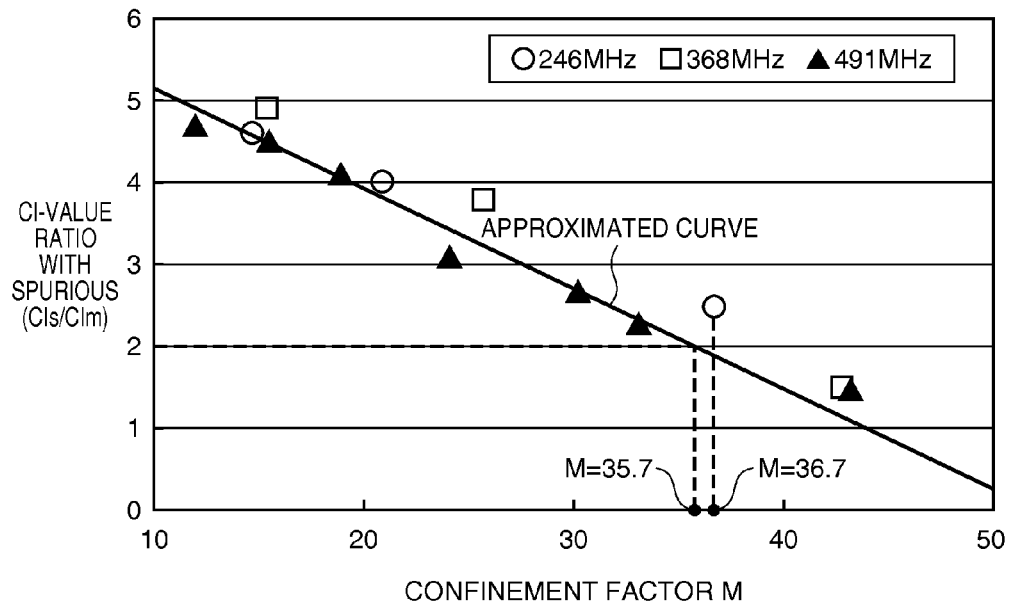
FIG. 9 is a diagram showing a CI-value ratio between a principal-vibration CI value of a resonator and a spurious CI value with respect to the energy trap coefficient M.

FIG. 9 shows the CI-value ratio (CIs/CIm) between the CI value (CIm) of the principal vibration and the CI value (CIs) of the spurious with respect to the energy trap coefficient M of the AT-cut quartz crystal resonator element shown in FIG. 7. As the energy trap coefficient M increases, the CI-value ratio (CIs/CIm) shows a tendency of decreasing, and the reason can be thought that the spurious in the inharmonic mode is strongly confined due to the increase in thickness or the area of the excitation electrode. According to FIG. 9, by setting the energy trap coefficient M to be equal to or lower than 35.7, the spurious specification (CIs/CIm≥2.0) required by the oscillator circuit can be satisfied.

Therefore, by setting the energy trap coefficient M to be equal to or higher than 17.1, the electrode film thickness of 50 nm or more with little ohmic loss influence can be assured, and therefore, it is possible to obtain the resonator element having the CI value with which the oscillator circuit can easily oscillate, and not affected by the spurious. Further, by setting the energy trap coefficient M in the resonator element with the resonant frequency equal to or higher than 200 MHz to be higher than the energy trap coefficient M as a design value for the 20 MHz band or the 30 MHz band, it becomes possible to further concentrate the vibration energy into the central portion of the excitation electrode. Therefore, since the amount of cut-out in the four corners of the excitation electrode can be increased, it becomes possible to make the equivalent parallel capacitance C0 smaller, and to further decrease the capacitance ratio γ. Therefore, by repeatedly performing the simulations and the experiments, the inventors of the invention have realized the fact that it is very effective in the high-frequency band to cut out the four corners of the excitation electrode while increasing the energy trap coefficient M.

However, it has turned out that if the energy trap coefficient M exceeds 35.7, the spurious with the CI value lower than that of the principal vibration occurs, and therefore, it is necessary to set the energy trap coefficient M to be equal to or lower than 35.7.

From the result described above, it has turned out that if the shape and the area are different between the first excitation electrode 25a and the second excitation electrode 25b, the CI value specification (CI20Ω) and the spurious specification (CIs/CIm≥2.0) required by the oscillator circuit are simultaneously fulfilled only in the case in which the energy trap coefficient M fulfills 17.1≤M≤35.7. It should be noted that the energy trap coefficient M can be within the range of 15.5≤M≤36.7 taking the production tolerance and the production error of the excitation electrode into consideration.

In the embodiment shown in FIG. 1A, the amount of the area of the first excitation electrode 25a on the recessed surface side (the obverse side in FIG. 1B) is set to the level with which the first excitation electrode 25a fits into the outer edge of the outer shape of the excitation electrode 25b on the flat surface side (the reverse side in FIG. 1B). In other words, the first excitation electrode 25a is formed to have a shape smaller than that of the second excitation electrode 25b. Therefore, in the case of forming the first excitation electrode 25a and the second excitation electrode 25b using a metal mask method, since the area of the portions opposed to each other of the first excitation electrode and the second excitation electrode hardly varies even if some displacement occurs in forming the electrodes, there arises no variation of the equivalent series capacitance C1 and the equivalent parallel capacitance C0, and the resonator element with a small variation of the capacitance ratio γ can be obtained.

It should be noted that although the example of the second excitation electrode 25b with the rectangular shape is described in the embodiment, there is no need to limit the invention thereto, but a circular shape and an elliptical shape can also be adopted.

The frequency adjustment accuracy of the resonator allows the adjustment within 20 ppm in the case in which the resonant frequency is in the frequency band lower than 200 MHz, and no problem has arisen in terms of the yield. However, due to the thinning of the vibrating portion corresponding to increase in frequency, the frequency adjustment accuracy has degraded to about 30 ppm through 40 ppm in the case in which the resonant frequency is in the frequency band equal to or higher than 200 MHz, which is about 1.5 through 2 times as worse as that in the frequency band lower than 200 MHz. As the countermeasure, the adjustment time is delayed, and the adjustment is separated into two, namely a coarse adjustment and a fine adjustment, but no significant improvement can have been obtained. Therefore, the fact that it is possible to decrease the capacitance ratio γ and to broaden the pull range of the oscillator by changing the excitation electrode shape without changing the manufacturing process is very effective for improving the frequency adjustment accuracy yield of the resonator equal to or higher than 200 MHz.

It should be noted that the upper limit of the frequency, which can be realized by this equipment, is expected to be about 800 MHz.

2. Resonator

Then, the resonator (the resonator according to the invention) to which the resonator element 1 described above is applied will be explained.

Figure 10A:
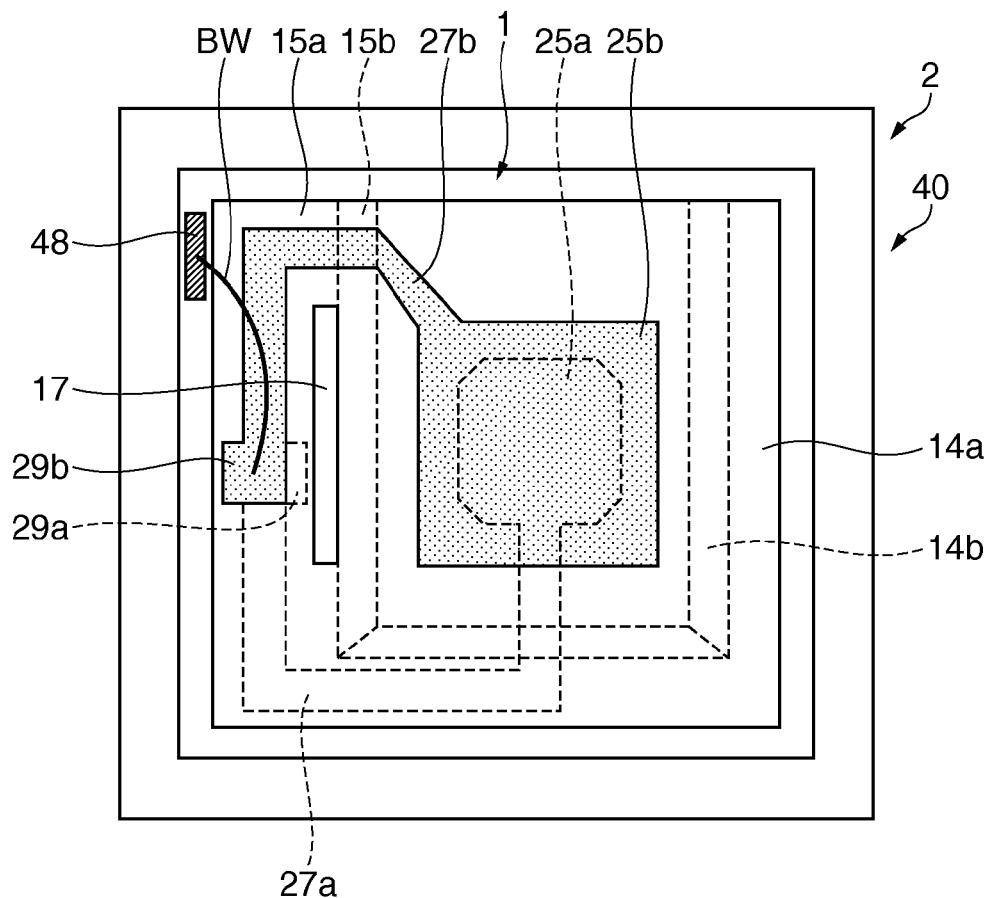
Figure 10B:
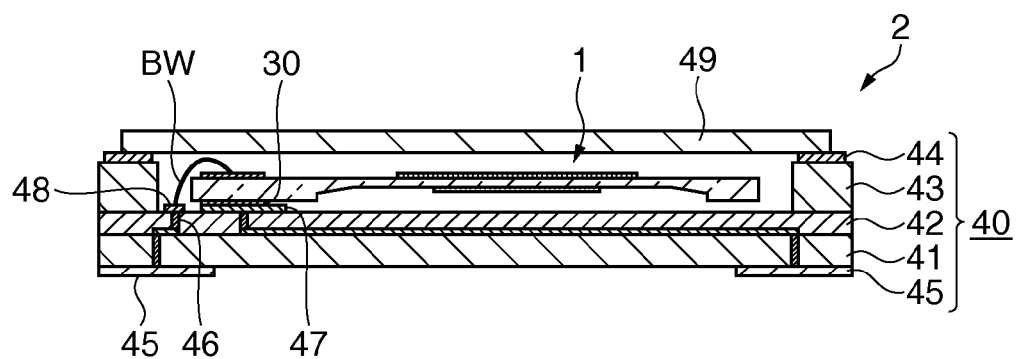

FIGS. 10A and 10B are diagrams showing a configuration of the resonator according to an embodiment of the invention, wherein FIG. 10A is a plan view with a lid member omitted, and FIG. 10B is a vertical cross-sectional view. The resonator 2 is composed of the resonator element 1, a package main body 40 formed to have a rectangular box shape in order to house the resonator element 1, and a lid member 49 made of, for example, metal, ceramic, or glass.

As shown in FIGS. 10A and 10B, the package main body 40 is formed by stacking a first substrate 41, a second substrate 42, a third substrate 43, a seal ring 44, a plurality of mounting terminals 45 on each other. The plurality of mounting terminals 45 is formed on an exterior bottom surface of the first substrate 41. The third substrate 43 is a ring-like member with the central portion removed, and on the upper peripheral edge of the third substrate 43, there is formed the seal ring 44 made of, for example, Kovar™.

The third substrate 43 and the second substrate 42 constitute a recessed section (a cavity) for housing the resonator element 1. At predetermined positions on the upper surface of the second substrate 42, there is disposed a plurality of element mounting pads 47 having electrical conduction with the mounting terminals 45 with conductors 46. The element mounting pads 47 are arranged so as to correspond to the pad electrode 29a provided to the second thick-wall main body 15a when mounting the resonator element 1.

When fixing the resonator element 1, firstly, the resonator element 1 is flipped (reversed), then the pad electrode 29a is mounted on the element mounting pads 47 coated with an electrically conductive adhesive 30, and then load is applied thereon. As the electrically conductive adhesive 30, a polyimide adhesive with little outgas is used taking aging into consideration.

Then, in order to cure the electrically conductive adhesive 30 of the resonator element 1 mounted on the package main body 40, the package main body 40 and the resonator element are put into a high-temperature oven at predetermined temperature for a predetermined time period. After curing the electrically conductive adhesive 30, the pad electrode 29b having appeared on the upper surface by flipping and an electrode terminal 48 of the package main body 40 are conductively connected to each other with a bonding wire BW. As shown in FIG. 10B, since the resonator element 1 is supported by and fixed to the package main body 40 at one place (one point), it becomes possible to reduce the level of the stress generated by supporting and fixing the resonator element 1.

After performing an annealing treatment thereon, frequency adjustment is performed by adding or removing a mass to or from the second excitation electrode 25b. Subsequently, the lid member 49 is mounted on the seal ring 44 formed on the upper surface of the package main body 40, and then sealing is performed by seam welding the lid member 49 in a reduced-pressure atmosphere, or a nitrogen gas atmosphere to thereby complete the resonator 2. Alternatively, there can also be adopted a method of mounting the lid member 49 on a low-melting-point glass applied on the upper surface of the third substrate 43 of the package main body 40, and then melting the low-melting-point glass to thereby make the lid member 49 adhere. Also in this case, the cavity of the package is kept in the reduced-pressure atmosphere or filled with an inert gas such as a nitrogen gas to thereby complete the resonator 2.

It is also possible to configure the resonator element 1 having the pad electrodes 29a, 29b formed apart from each other in the Z'-axis direction. Also in this case, the resonator can be configured in a similar manner to the case of the resonator 2 explained with reference to FIGS. 10A and 10B. Further, it is also possible to configure the resonator element 1 having the pad electrodes 29a, 29b formed on the same surface with a certain interval. In this case, the resonator element 1 has a structure of achieving the conduction, support, and fixation by applying the electrically conductive adhesive 30 at two places (two points). Although the structure is suitable for height reduction, the mounting stress caused by the electrically conductive adhesive 30 might be a little bit stronger.

Although the example of using the laminate substrate as the package main body 40 is hereinabove explained as the resonator 2 according to the embodiment, it is also possible to configure the resonator using a single layer ceramic substrate as the package main body 40, and using a cap on which drawing is performed as the lid member.

As shown in FIGS. 10A and 10B, since the stress caused by the electrically conductive adhesive 30 can be reduced by supporting the resonator element 1 at one point, and disposing the slit 17 between the thick-wall section 13 and the vibrating section 12, there is an advantage that the resonator 2 superior in frequency reproducibility, frequency-temperature characteristic, CI-temperature characteristic, and frequency-aging characteristic can be obtained.

3. Electronic Device

Then, the oscillator (the electronic device according to the embodiment of the invention) to which the resonator element according to the embodiment of the invention is applied will be explained.

Figure 11A:
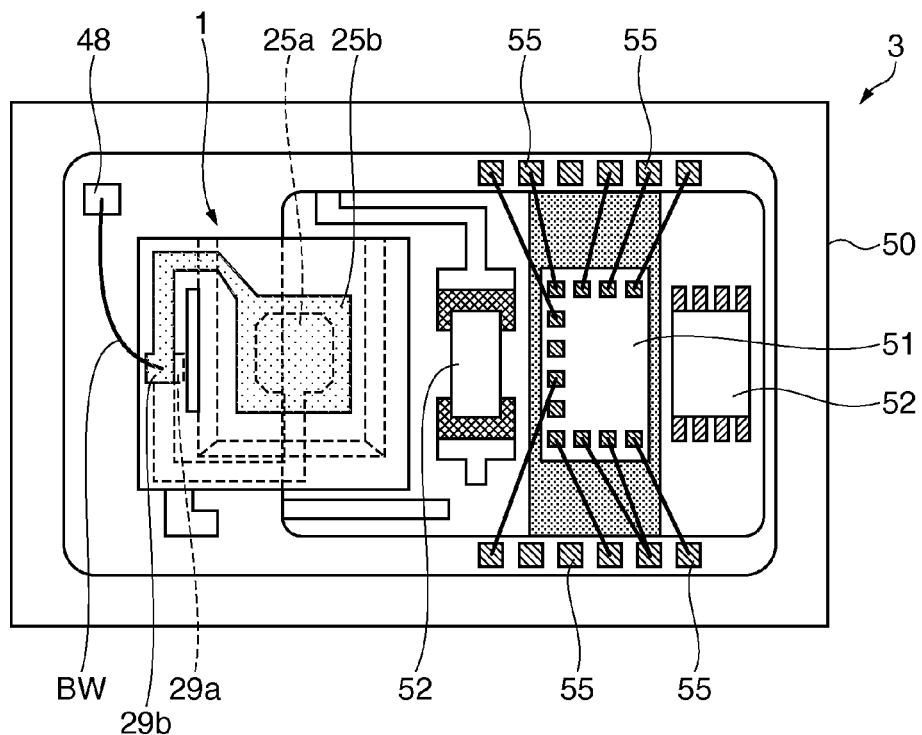
Figure 11B:
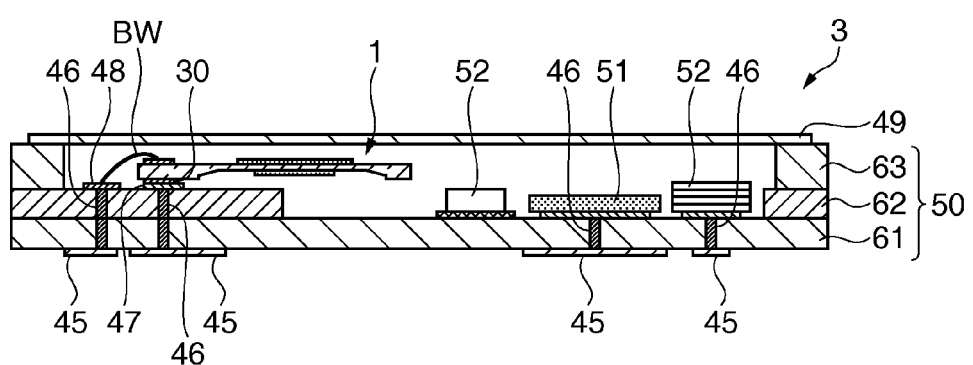

FIGS. 11A and 11B are diagrams showing a configuration of the electronic device according to the embodiment of the invention, wherein FIG. 11A is a plan view with the lid member omitted, and FIG. 11B is a vertical cross-sectional view. The electronic device 3 is provided with a package main body 50, the lid member 49, the resonator element 1, an IC component 51 equipped with the oscillator circuit for exciting the resonator element 1, and at least one of electronic components 52 including a variable capacitance element, the capacitance of which varies in accordance with an applied voltage, a thermistor, the resistance of which varies in accordance with the temperature, an inductor, and so on.

As shown in FIGS. 11A and 11B, the package main body 50 is formed by stacking a first substrate 61, a second substrate 62, and a third substrate 63 on each other. The plurality of mounting terminals 45 is formed on an exterior bottom surface of the first substrate 61. The second substrate 62 and the third substrate 63 are each formed of a ring-like member with a central portion removed.

The first substrate 61, the second substrate 62, and the third substrate 63 constitute a recessed section (a cavity) for housing the resonator element 1, the IC component 51, the electronic component 52, and so on. At predetermined positions on the upper surface of the second substrate 62, there is disposed a plurality of element mounting pads 47 having electrical conduction with the mounting terminals 45 with conductors 46. The element mounting pads 47 are arranged so as to correspond to the pad electrode 29a provided to the second thick-wall main body 15a when mounting the resonator element 1.

The pad electrode 29a of the resonator element 1 flipped is mounted on the element mounting pads 47 of the package main body 50 coated with the electrically conductive adhesive (polyimide series) 30 to thereby achieve conduction between the pad electrode 29a and the element mounting pads 47. The pad electrode 29a having appeared on the upper surface by flipping and the electrode terminal 48 of the package main body 50 are connected to each other with the bonding wire BW to thereby achieve conduction with one of the electrode terminals 55 of the IC component 51 via a conductor formed between the substrates of the package main body 50. The IC component 51 is fixed at a predetermined position of the package main body 50, and then, the terminals of the IC component 51 and the electrode terminals 55 of the package main body 50 are connected to each other with the bonding wires BW. Further, the electronic component 52 is mounted at a predetermined position of the package main body 50, and is connected to the conductors 46 with metal bumps and so on. The package main body 50 is kept in a reduced-pressure atmosphere or filled with an inert gas such as a nitrogen gas, and then the package main body 50 is sealed with the lid member 49 to thereby complete the electronic device 3.

The method of connecting the pad electrode 29b and the electrode terminal 48 of the package main body 50 to each other with the bonding wire BW reduces the mounting stress caused by the electrically conductive adhesive 30 since the resonator element 1 is supported by one region (at one point). Further, since the resonator element 1 is flipped to set the excitation electrode 25b with a larger size to the upper side when housing the resonator element 1 in the package main body 50, the frequency adjustment of the electronic device 3 becomes easy.

By configuring the electronic device 3 as shown in FIGS. 11A and 11B, since the high-frequency resonator element 1 excited with the fundamental wave is used, the capacitance ratio is low, and the variable range of the frequency is broadened. Further, there is obtained an advantage that a voltage controlled oscillator with a preferable S/N ratio can be obtained.

Further, an oscillator, a temperature compensated oscillator, and so on can be configured as the electronic device 3, and there can be obtained an advantage that an oscillator superior in frequency reproducibility, aging characteristic, and frequency-temperature characteristic can be configured.

4. Electronic Apparatuses

Then, the electronic apparatuses (the electronic apparatuses according to the embodiment of the invention) to which the resonator element according to the embodiment of the invention is applied will be explained in detail with reference to FIGS. 12 through 14.

Figure 12:
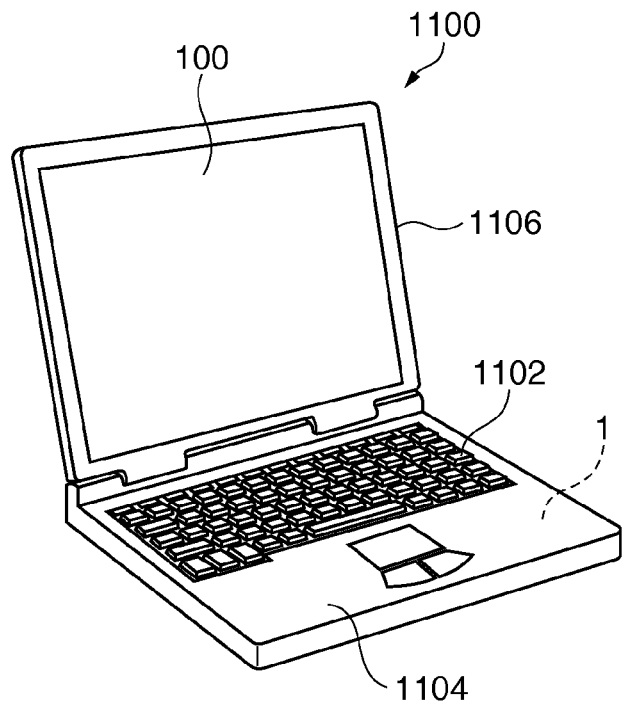
FIG. 12 is a perspective view showing a configuration of a mobile type (or laptop type) of personal computer as an example of the electronic apparatus equipped with the resonator element according to an embodiment of the invention.

FIG. 12 is a perspective view showing a configuration of a mobile type (or a laptop type) of personal computer as the electronic apparatus equipped with the resonator element according to the embodiment of the invention. In the drawing, the personal computer 1100 is composed of a main body section 1104 provided with a keyboard 1102, and a display unit 1106 provided with a display section 100, and the display unit 1106 is pivotally supported with respect to the main body section 1104 via a hinge structure. Such a personal computer 1100 incorporates the resonator element 1 functioning as a filter, a resonator, a reference clock, and so on.

Figure 13:
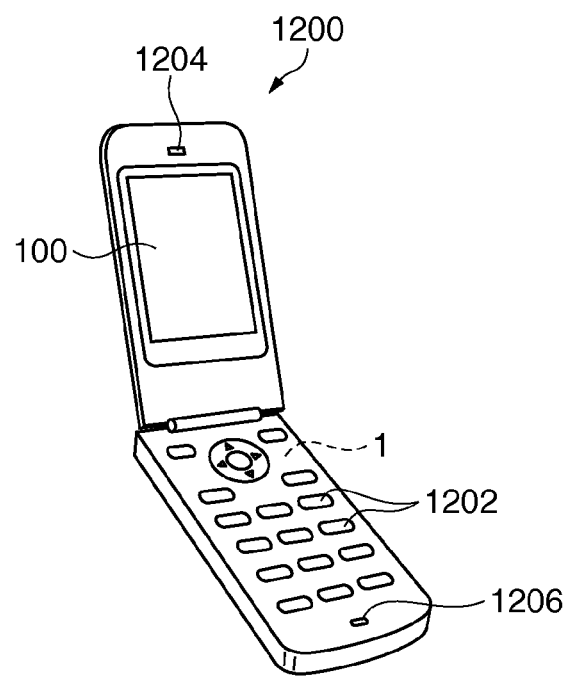
FIG. 13 is a perspective view showing a configuration of a cellular phone (including PHS) as an example of the electronic apparatus equipped with the resonator element according to an embodiment of the invention.

FIG. 13 is a perspective view showing a configuration of a cellular phone (including PHS) as the electronic apparatus equipped with the resonator element according to the embodiment of the invention. In this drawing, the cellular phone 1200 is provided with a plurality of operation buttons 1202, an ear piece 1204, and a mouthpiece 1206, and a display section 100 is disposed between the operation buttons 1202 and the ear piece 1204. Such a cellular phone 1200 incorporates the resonator element 1 functioning as a filter, a resonator, and so on.

Figure 14:
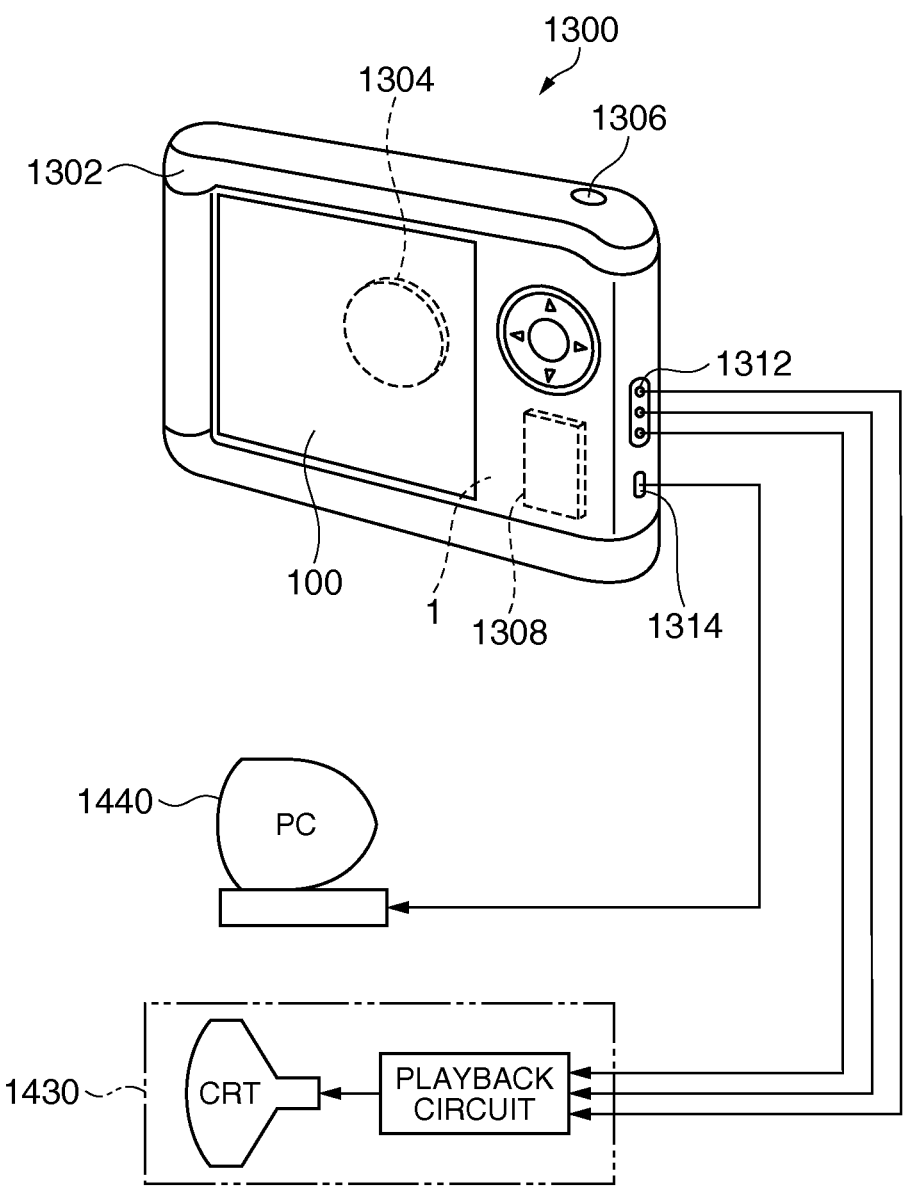
FIG. 14 is a perspective view showing a configuration of a digital still camera as an example of the electronic apparatus equipped with the resonator element according to an embodiment of the invention.

FIG. 14 is a perspective view showing a configuration of a digital still camera as the electronic apparatus equipped with the resonator element according to the embodiment of the invention. It should be noted that connection with external equipment is also shown schematically in this drawing. Here, existing cameras expose a silver salt film to an optical image of an object, while the digital still camera 1300 performs photoelectric conversion on an optical image of an object by an imaging element such as a CCD (a charge coupled device) to generate an imaging signal (an image signal).

A case (a body) 1302 of the digital still camera 1300 is provided with a display section 100 disposed on the back surface thereof to have a configuration of performing display in accordance with the imaging signal from the CCD, wherein the display section 100 functions as a viewfinder for displaying the object as an electronic image. Further, the front surface (the back side in the drawing) of the case 1302 is provided with a light receiving unit 1304 including an optical lens (an imaging optical system), the CCD, and so on.

When the photographer confirms an object image displayed on the display section 100, and then holds down a shutter button 1306, the imaging signal from the CCD at that moment is transferred to and stored in the memory device 1308. Further, the digital still camera 1300 is provided with video signal output terminals 1312 and an input-output terminal 1314 for data communication disposed on a side surface of the case 1302. Further, as shown in the drawing, a television monitor 1430 and a personal computer 1440 are respectively connected to the video signal output terminals 1312 and the input-output terminal 1314 for data communication according to needs. Further, there is adopted the configuration in which the imaging signal stored in the memory device 1308 is output to the television monitor 1430 and the personal computer 1440 in accordance with a predetermined operation. Such a digital still camera 1300 incorporates the resonator element 1 functioning as a filter, a resonator, and so on.

It should be noted that, as the electronic apparatus equipped with the resonator element according to the embodiment of the invention, there can be cited, for example, an inkjet ejection device (e.g., an inkjet printer), a laptop personal computer, a television set, a video camera, a video cassette recorder, a car navigation system, a pager, a personal digital assistance (including one with a communication function), an electronic dictionary, an electric calculator, a computerized game machine, a word processor, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, various types of measurement instruments, various types of gauges (e.g., gauges for a vehicle, an aircraft, or a ship), and a flight simulator besides the personal computer (the mobile personal computer) shown in FIG. 12, the cellular phone shown in FIG. 13, and the digital still camera shown in FIG. 14.

5. Mobile Object

Then, the mobile object (the mobile object according to the embodiment of the invention) to which the resonator element according to the embodiment of the invention is applied will be explained.

Figure 15:
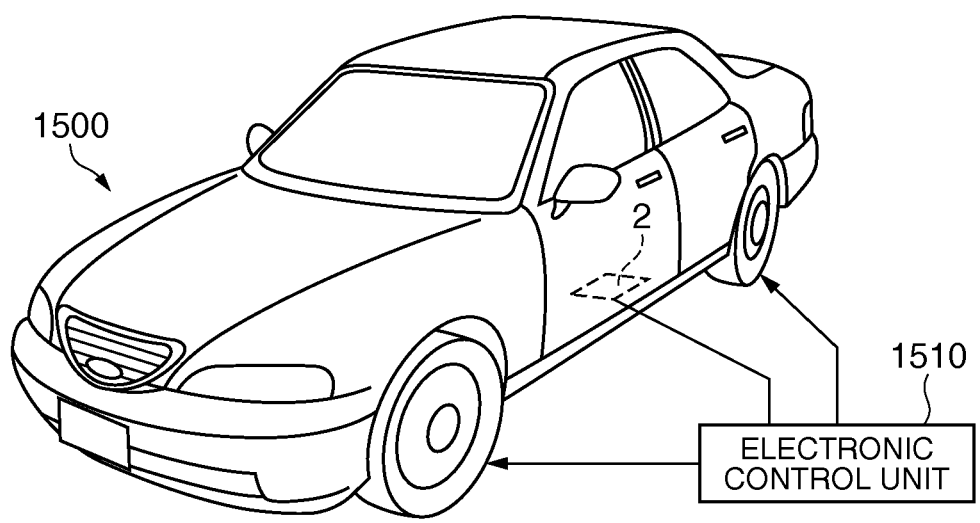
FIG. 15 is a perspective view schematically showing a vehicle as an example of the mobile object according to the invention.

FIG. 15 is a perspective view schematically showing a vehicle as an example of the mobile object according to the invention. The vehicle 1500 is equipped with the resonator 2 (or the resonator element 1). The resonator 2 can widely be applied to an electronic control unit (ECU) 1510 such as a keyless entry system, an immobilizer, a car navigation system, a car air-conditioner, an anti-lock braking system (ABS), an air-bag system, a tire pressure monitoring system (TPMS), an engine controller, a battery monitor for a hybrid car or an electric car, or a vehicle posture control system.

Although the resonator element, the resonator, the oscillator, the electronic apparatus, and the mobile object according to the invention are hereinabove explained based on the embodiments shown in the accompanying drawings, the invention is not limited thereto, but the configuration of each of the constituents can be replaced with one having an arbitrary configuration with an equivalent function. Further, it is possible to add any other constituents to the invention. Further, it is also possible to arbitrarily combine any of the embodiments.

The entire disclosure of Japanese Patent Application No. 2012-070897, filed Mar. 27, 2012 and Japanese Patent Application No. 2013-027618, filed Feb. 15, 2013 is expressly incorporated by reference herein.

What is claimed is:

1. A resonator element comprising:
a substrate including a first principal surface and a second principal surface opposite to the first principal surface, and the substrate vibrating in a thickness-shear vibration mode;
a first excitation electrode disposed on the first principal surface, and including a side or a circumference having an internal contact with an imaginary quadrangle; and
a second excitation electrode disposed on the second principal surface,
wherein assuming that an area of the quadrangle is S1, and an area of the first excitation electrode is S2, the following relationship is fulfilled:

$$87.7\% \leq (S2/S1) < 95.0\%, \text{ and}$$

the second excitation electrode is larger than the imaginary quadrangle in a plan view, the following relationships are fulfilled:

$$M = K \times (hx/2 \times ts) \times \sqrt{\Delta},$$

$$\Delta = (fs - fe)/fs$$

$$fs = R/[ts + te2 \times (\rho e/\rho x)]$$

$$fe = R/[ts + te \times (\rho e/\rho x)]$$

$$15.5 \leq M \leq 36.7$$

where:
M denotes an energy trap coefficient;
K denotes an anisotropy coefficient of the substrate;
hx denotes a length of the first excitation electrode along a thickness-shear vibration direction;
ts denotes a thickness of the substrate;
Δ denotes an amount of frequency drop;
fs denotes a cut-off frequency of the substrate;
fe denotes a frequency when the excitation electrodes are disposed on the substrate;
R denotes a frequency constant of the substrate;
te denotes a sum of a thickness of the first excitation electrode and a thickness of the second excitation electrode;
te2 denotes the thickness of the second excitation electrode;
ρe denotes a density of the excitation electrodes; and
ρx denotes a density of the substrate.

2. The resonator element according to claim 1, wherein the first excitation electrode has a shape obtained by cutting out at least three corners of the quadrangle.

3. The resonator element according to claim 1, wherein the first excitation electrode fits into an outer edge of the second excitation electrode in a plan view.

4. The resonator element according to claim 2, further comprising:
a lead electrode disposed so as to extend from an outer edge of a part of the first excitation electrode other than the cut-out part.

5. The resonator element according to claim 1, wherein the following is fulfilled:

$$17.1 \leq M \leq 135.7.$$

6. The resonator element according to claim 1, wherein assuming that hz denotes a length of the first excitation electrode along a direction perpendicular to the thickness-shear vibration direction,
the following is fulfilled:

$$1.25 \leq hx/hz \leq 1.31.$$

7. The resonator element according to claim 1, wherein the substrate is a quartz crystal substrate.

8. The resonator element according to claim 7, wherein the quartz crystal substrate is an AT-cut quartz crystal crystal substrate.

9. A resonator comprising:
the resonator element according to claim 1; and
a package adapted to house the resonator element.

10. A resonator comprising:
the resonator element according to claim 2; and
a package adapted to house the resonator element.

11. A resonator comprising:
the resonator element according to claim 3; and
a package adapted to house the resonator element.

12. An electronic device comprising:
the resonator element according to claim 1; and
an oscillator circuit adapted to drive the resonator element.

13. An electronic device comprising:
the resonator element according to claim 2; and
an oscillator circuit adapted to drive the resonator element.

14. An electronic device comprising:
the resonator element according to claim 3; and
an oscillator circuit adapted to drive the resonator element.

15. An electronic apparatus comprising:
the resonator element according to claim 1.

16. An electronic apparatus comprising:
the resonator element according to claim 2.

17. An electronic apparatus comprising:
the resonator element according to claim 3.

18. A mobile object comprising:
the resonator element according to claim 1.

19. A mobile object comprising:
the resonator element according to claim 2.

* * * * *